United States Patent
Nakagawa et al.

(10) Patent No.: US 8,691,123 B2
(45) Date of Patent: Apr. 8, 2014

(54) FINE PROCESSING METHOD, FINE PROCESSING APPARATUS, AND RECORDING MEDIUM WITH FINE PROCESSING PROGRAM RECORDED THEREON

(75) Inventors: Yasutada Nakagawa, Kanagawa-ken (JP); Takuya Kono, Kanagawa-ken (JP); Ikuo Yoneda, Kanagawa-ken (JP); Masayuki Hatano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 282 days.

(21) Appl. No.: 13/204,844

(22) Filed: Aug. 8, 2011

(65) Prior Publication Data
US 2012/0074605 A1 Mar. 29, 2012

(30) Foreign Application Priority Data

Sep. 24, 2010 (JP) .................................. 2010-214422

(51) Int. Cl.
*B29C 43/58* (2006.01)
(52) U.S. Cl.
USPC .......... 264/40.4; 264/40.1; 264/406; 264/494; 264/496; 425/135; 425/140; 425/145; 425/174; 425/174.6; 425/375; 425/385
(58) Field of Classification Search
USPC ........ 264/40.1, 40.4, 406, 494, 496; 425/174, 425/174.6, 385, 135, 140, 145, 375
See application file for complete search history.

(56) References Cited

U.S. PATENT DOCUMENTS

| 6,929,762 | B2 * | 8/2005 | Rubin .......................... 264/40.1 |
| 7,360,851 | B1 * | 4/2008 | Snyder .............................. 347/2 |
| 2004/0163563 | A1 * | 8/2004 | Sreenivasan et al. ......... 101/494 |
| 2007/0141271 | A1 * | 6/2007 | Xu et al. ........................ 427/508 |
| 2007/0278712 | A1 * | 12/2007 | Okushima et al. ............ 264/236 |
| 2009/0014917 | A1 | 1/2009 | Hodge et al. |
| 2009/0115110 | A1 | 5/2009 | Schumaker |
| 2010/0098859 | A1 * | 4/2010 | Schumaker ................... 427/256 |
| 2010/0187714 | A1 * | 7/2010 | Kobiki et al. ................. 264/135 |

FOREIGN PATENT DOCUMENTS

JP 2007-320098 12/2007

OTHER PUBLICATIONS

U.S. Appl. No. 13/832,570, filed Mar. 15, 2013, Nakagawa, et al.

* cited by examiner

*Primary Examiner* — Timothy Kennedy
(74) *Attorney, Agent, or Firm* — Oblon, Spivak, McClelland, Maier & Neustadt, L.L.P.

(57) ABSTRACT

According to one embodiment, a fine processing method includes determining a resist amount required for each first region of a pattern formation surface and a total amount of resist. The method include dividing the total amount of resist by a volume of one resist drop to determine the resist drops total number. The method include determining a provisional position for the resist drop of the total number. The method include assigning the each first region to nearest one resist drop, and partitioning again the pattern formation surface into second regions assigned to the each resist drop. The method include determining a divided value by dividing the volume of the one resist drop by the required total amount of resist determined. The method include finalizing a final position of the each resist drop, if a distribution of the divided value in the pattern formation surface falls within a target range.

16 Claims, 10 Drawing Sheets

LAYER THICKNESS DISTRIBUTION

FIG. 5A

CORRECTION AMOUNT DISTRIBUTION

# FINE PROCESSING METHOD, FINE PROCESSING APPARATUS, AND RECORDING MEDIUM WITH FINE PROCESSING PROGRAM RECORDED THEREON

CROSS-REFERENCE TO RELATED APPLICATIONS

This application is based upon and claims the benefit of priority from the prior Japanese Patent Application No. 2010-214422, filed on Sep. 24, 2010; the entire contents of which are incorporated herein by reference.

FIELD

Embodiments described herein relate generally to a fine processing method, a fine processing apparatus, and a recording medium with fine processing program recorded thereon.

BACKGROUND

With the miniaturization and higher packing density of semiconductor devices, the photolithography apparatus is required to have higher accuracy. However, in realizing fine processing at several ten nanometers or less, photolithography technology reaches the resolution limit. Hence, nanoimprint is drawing attention as one of the next-generation fine processing technologies.

In nanoimprint, for instance, liquid droplets of resist (hereinafter, resist drops) are dropped on a foundation. A template having a protrusion-depression pattern is pressed to the resist drops. Thus, a resist layer having a protrusion-depression pattern is formed between the template and the foundation.

However, in general, the pattern density of the template is not uniform. Furthermore, the resist is typically an organic material, and hence volatile. Thus, on the foundation, local deficiency and excess of resist drops may occur, or unevenness may occur in the residual layer thickness of the resist. Hence, control is needed to prevent deficiency and excess of resist drops depending on the pattern shape of the template and the volatilization amount of the resist.

Thus, the problem is how to properly arrange resist drops on the foundation before performing nanoimprint. By proper arrangement of resist drops, fine processing with high accuracy can be realized.

BRIEF DESCRIPTION OF THE DRAWINGS

FIG. 8A and FIG. 8B are views describing the initial arrangement of resist drops.

DETAILED DESCRIPTION

In general, according to one embodiment, a fine processing method is disclosed for two-dimensionally arranging each of a plurality of resist drops on a pattern formation surface and pressing a template including protrusions and depressions onto the resist drops to form a resist pattern on the pattern formation surface. The method can include partitioning the pattern formation surface into a plurality of first regions and determining an amount of resist required for each of the first regions. One of first regions is smaller than an area occupied by one of the resist drops. The method can include determining a total amount of resist required for an entire region of the pattern formation surface from the amount of resist. The method can include dividing the total amount of resist by a volume of the one of the resist drops to determine a total number of the resist drops arranged on the pattern formation surface. The method can include determining a provisional position on the pattern formation surface for each of the resist drops of the total number as a first position. The method can include assigning the first regions to the each of the resist drops, each group of the first regions assigned to the each of the resist drops being nearest to the each of the resist drops, defining the each group of the first regions as each of a plurality of second regions, and partitioning again the pattern formation surface into the second regions. The method can include dividing, for the each of the second regions, the volume of the one of the resist drops by a sum of the amount of resist required for the each of the first regions belonging to the each of the second regions to determine a divided value. The method can include finalizing a final position of the each of the resist drops as a second position, if a distribution of the divided value in the pattern formation surface falls within a target range. In addition, the method can include moving at least one of the resist drops, the partitioning, and the determining the divided value until the distribution falls within the target range, if the distribution of the divided value in the pattern formation surface does not fall within the target range.

In general, according to one embodiment, in fine processing for two-dimensionally arranging each of a plurality of resist drops on a pattern formation surface and pressing a template including protrusions and depressions onto the resist drops to form a resist pattern on the pattern formation surface, a fine processing apparatus is provided for determining positions of the plurality of resist drops on the pattern formation surface. The apparatus includes a first determination unit, a second determination unit, a third determination unit, a fourth determination unit, a partitioning unit, a fifth determination unit, and a repeating unit. The first determination unit is configured to partition the pattern formation surface into a plurality of first regions and to determine an amount of resist required for each of the first regions. One of first regions is smaller than an area occupied by one of the resist drops. The second determination unit is configured to determine a total amount of resist required for an entire region of the pattern formation surface from the amount of resist. The third determination unit is configured to divide the total amount of resist by a volume of the one of the resist drops to determine a total number of the resist drops arranged on the pattern formation surface. The fourth determination unit is configured to determine a provisional position on the pattern formation surface for each of the resist drops of the total number as a first position. The partitioning unit is configured to assign the first regions to the each of the resist drops, each group of the first regions assigned to the each of the resist drops being nearest to the each of the resist drops, to define the each group of the first regions as each of a plurality of second regions, and to partition again the pattern formation surface into the second regions. The fifth determination unit is configured to divide, for the each of the second regions, the volume of the one of the resist drops by a sum of the amount of resist required for the each of the first regions belonging to the each of the second regions to determine a divided value. The repeating unit is configured to finalize final position of the each of the resist drops as a second position, if a distribution of the divided value in the pattern formation surface falls within a target range, and to repeat moving at least one of the resist drops, the partitioning, and the determining the divided value until the distribution falls within the target range, if the distribution of the divided value in the pattern formation surface does not fall within the target range.

In general, according to one embodiment, a recording medium with a fine processing program recorded on the recording medium is provided. The fine processing program causes a computer to perform partitioning a pattern formation surface into a plurality of first regions and determining an amount of resist required for each of the first regions. One of the first regions is smaller than an area occupied by one resist drop. The program causes a computer to perform determining a total amount of resist required for an entire region of the pattern formation surface from the amount of resist. The program causes a computer to perform dividing the total amount of resist by a volume of the one of the resist drops to determine a total number of the resist drops arranged on the pattern formation surface. The program causes a computer to perform determining a provisional position on the pattern formation surface for each of the resist drops of the total number as a first position. The program causes a computer to perform assigning the first regions to the each of the resist drops, each group of the first regions assigned to the each of the resist drops being nearest to the each of the resist drops, defining the each group of the first regions as each of a plurality of second regions, and partitioning again the pattern formation surface into the second regions. The program causes a computer to perform dividing, for the each of the second regions, the volume of the one of the resist drops by a sum of the amount of resist required for the each of the first regions belonging to the each of the second regions to determine a divided value. In addition, the program causes a computer to perform finalizing final position of the each of the resist drops as a second position, if a distribution of the divided value in the pattern formation surface falls within a target range, and repeating moving at least one of the resist drops, the partitioning, and the determining the divided value until the distribution falls within the target range, if the distribution of the divided value in the pattern formation surface does not fall within the target range.

Various embodiments will be described hereinafter with reference to the accompanying drawings. The embodiment relates to fine processing of resist drops by nanoimprint, for instance.

Figure 1:
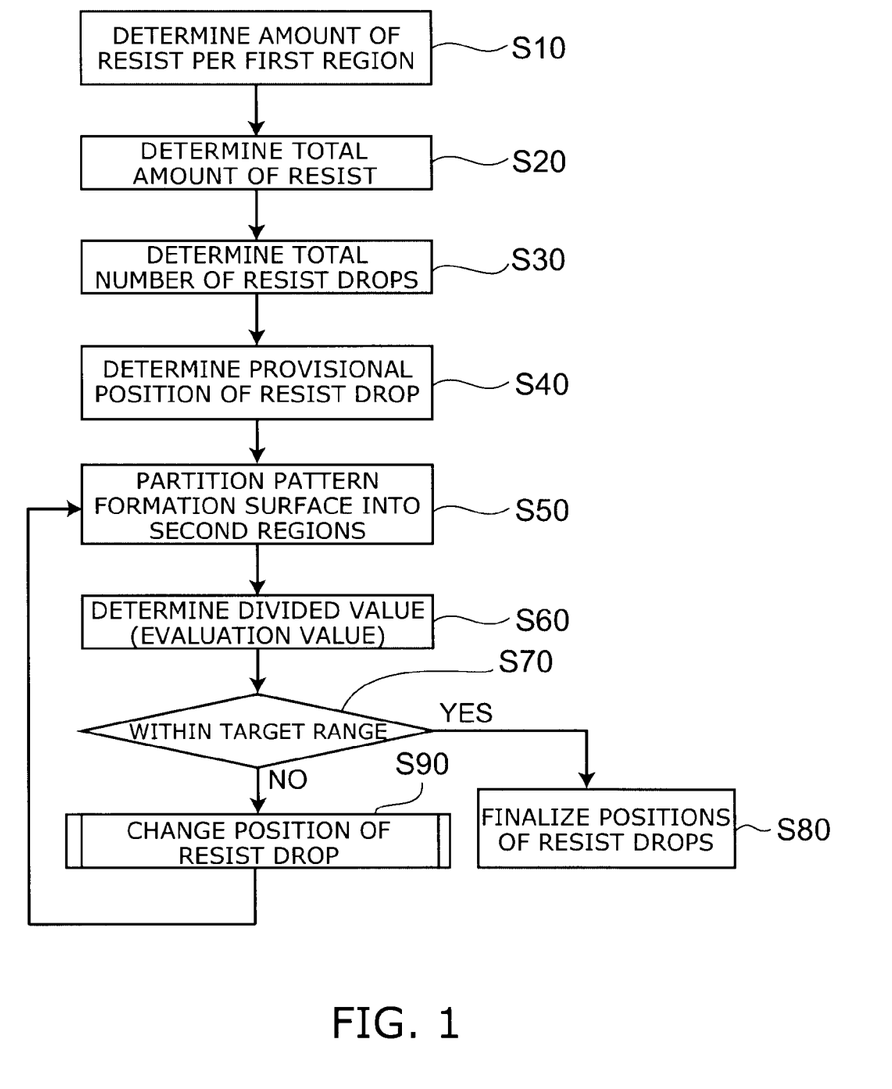
FIG. 1 is a flow chart summarizing a fine processing method according to the embodiment.

FIG. 1 is a flow chart summarizing a fine processing method according to the embodiment. In particular, FIG. 1 primarily summarizes a method for optimizing the resist drop arrangement.

In the nanoimprint according to the embodiment, a plurality of resist drops like liquid droplets are two-dimensionally arranged on a foundation such as a substrate by e.g. an ink jet method. Then, a template including protrusions and depressions is pressed onto the resist drops. Thus, a mask pattern on the order of nanometers is formed on the foundation. The supply amount of resist drops is determined in consideration of e.g. the pattern design of the electronic device.

First, the pattern formation surface is partitioned into a plurality of first regions. Here, the one of the first regions is smaller than the area occupied by one resist drop. The amount of resist required for each first region is determined (step S10).

Next, the amounts of resist of the first regions are summed to determine the total amount of resist required for the entire region of the pattern formation surface (step S20).

Next, the total amount of resist is divided by the volume of the resist drop to determine the total number of resist drops arranged on the pattern formation surface (step S30).

Next, for each resist drop of the above total number, a provisional position on the pattern formation surface is determined (step S40).

Here, in the embodiment, the determination of the initial provisional position for each resist drop is referred to as "initial arrangement" of the resist drops.

In this initial arrangement, the positions of the resist drops are determined with a prescribed distance spaced therebetween. For instance, the resist drops may be arranged at equal distances, or may be arranged in a state close to the final arrangement.

Next, each first region is assigned to the nearest resist drop. The group of the first regions (the set of the first regions) assigned to each resist drop is defined as a second region. The pattern formation surface is partitioned again into the second regions (step S50).

Next, for the each second region, the volume of one resist drop is divided by the sum of the required amount of resist determined for the first regions belonging to the second region to determine the divided value (evaluation value) (step S60). In the embodiment, this divided value is referred to as "evaluation value".

Next, it is determined whether the distribution of the divided values (evaluation values) in the pattern formation surface falls within a target range (step S70).

More specifically, for each second region, it is determined whether the volume of the resist drop is deficient or excessive. In the embodiment, this determination is referred to as "danger point evaluation".

For instance, in the second region where the volume of the resist drop is deficient, the pattern depression of the template may fail to be filled with the resist drop. Conversely, in the case where the volume of the resist drop is excessive, the residual layer thickness of the resist (the definition of which will be described later) may be thickened. Examples of the index of whether the distribution of the divided values (evaluation values) in the pattern formation surface falls within the target range include the difference between the maximum and the minimum of the evaluation value, the maximum of the absolute value of the difference between the evaluation value and "1", and the standard deviation.

Next, if the distribution of the divided values (evaluation values) in the pattern formation surface falls within the target range, the positions of all the resist drops are finalized (step S80). Thus, this flow is completed.

If the distribution of the divided values (evaluation values) in the pattern formation surface does not fall within the target range, the position of at least one of the resist drops is changed until the distribution falls within the target range (step S90).

That is, the at least one of the resist drops is moved until the distribution falls within the target range (step S90).

This change of the position is referred to as "arrangement update" of the resist drops. In the arrangement update, the position of at least one of the resist drops is changed. That is, the at least one of the resist drops is moved. Next, the flow returns to the partitioning step (step S50). Then, the partitioning step (step S50) and the step of determining the divided value (evaluation value) (step S60) are repeated.

That is, the routine of step S50, step S60, step S70, and step S90 is repeated until the distribution falls within the target range.

During this routine, the total amount of all the resist drops between the pattern formation surface and the template is constant, for instance. That is, during the routine, only the positions of the resist drops are changed.

During the operation of the routine, when the distribution of the evaluation values in the pattern formation surface falls within the target range, the positions of all the resist drops are finalized (step S80).

By such a flow, each resist drop is properly arranged on the pattern formation surface.

After the position of each resist drop 20d is finalized in step S80, the pattern processing described below is performed. The process of the pattern processing of resist drops is described in the following.

FIG. 2A to FIG. 3C and FIG. 3A to FIG. 3C are main part sectional schematic views describing the fine processing process according to the embodiment.

Figure 2A:
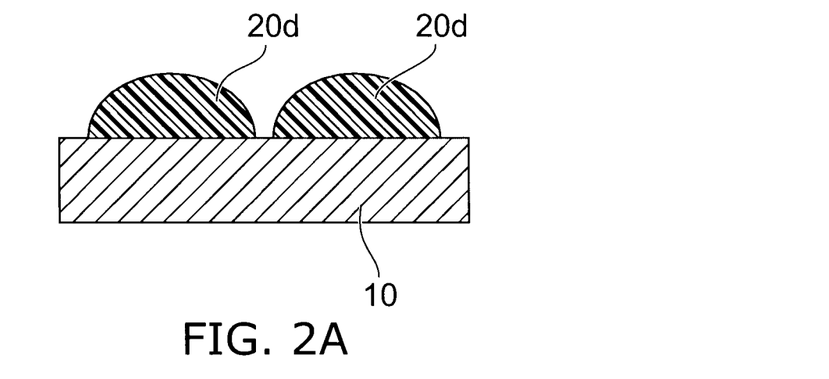
FIG. 2A to FIG. 2C and FIG. 3A to FIG. 3C are main part sectional schematic views describing the fine processing process according to the embodiment.

First, as shown in FIG. 2A, each resist drop 20d is arranged by e.g. an ink jet method on a foundation 10 such as a semiconductor layer surface and a semiconductor wafer surface. The volume of one resist drop 20d is set in the range of e.g. 1-6 pl (picoliters). The resist drop 20d at this stage is like a liquid droplet. The resist drop 20d is e.g. an acrylic photocurable resin, which is cured by irradiation with UV light. The resist drop 20d may be dropped on the foundation 10 by one shot, or by one or more shots.

Figure 2B:
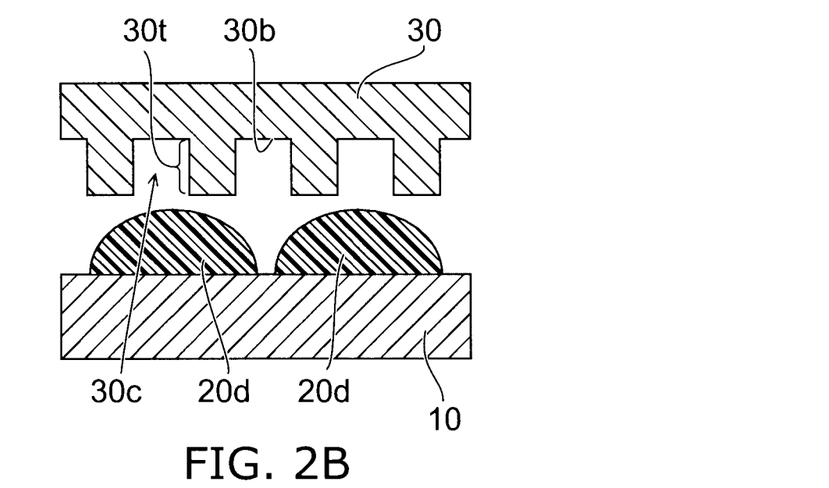

Next, as shown in FIG. 2B, a template 30 is opposed to the major surface of the foundation 10. A pattern including protrusions 30t and depressions 30c is formed at the template surface opposed to the foundation 10. The height of the protrusion 30t from the bottom surface 30b of the depression 30c is defined as "pattern height". The pattern height is e.g. 60 nm. The material of the template 30 is e.g. quartz ($SiO_2$).

Figure 2C:
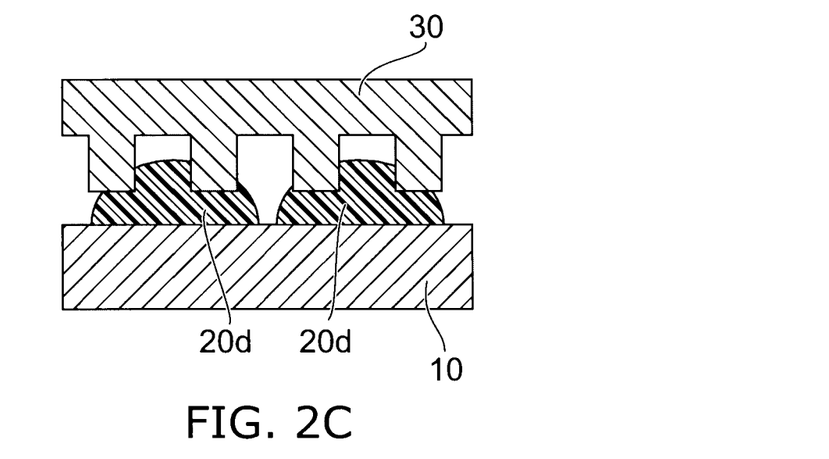

Next, as shown in FIG. 2C, the template 30 is lowered toward the foundation 10. Thus, the protrusion-depression pattern of the template 30 is pressed to the resist drops 20d.

Figure 3A:
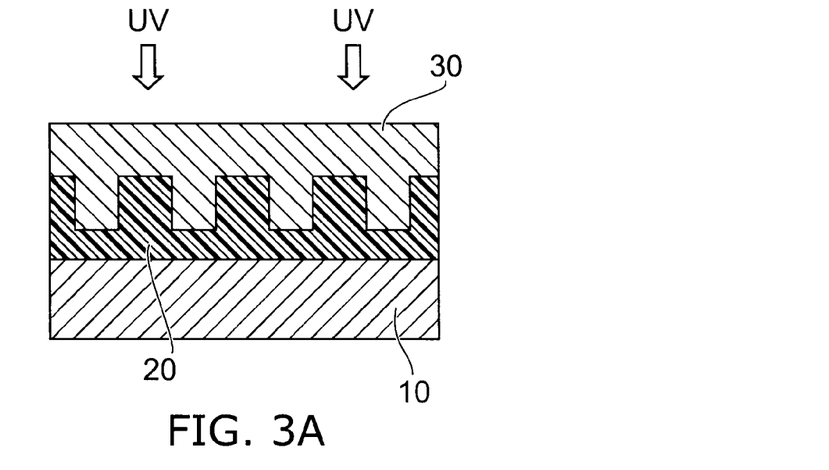

Each resist drop 20d pressed by the template 30 is three-dimensionally deformed on the foundation 10. Thus, the pattern of the template 30 is transferred onto the foundation 10. This state is shown in FIG. 3A.

A resist layer 20 with the surface deformed in a protrusion-depression pattern is formed between the template 30 and the foundation 10. The resist layer 20 is irradiated with UV light through the template 30. Thus, the resist layer 20 is photocured.

Figure 3B:
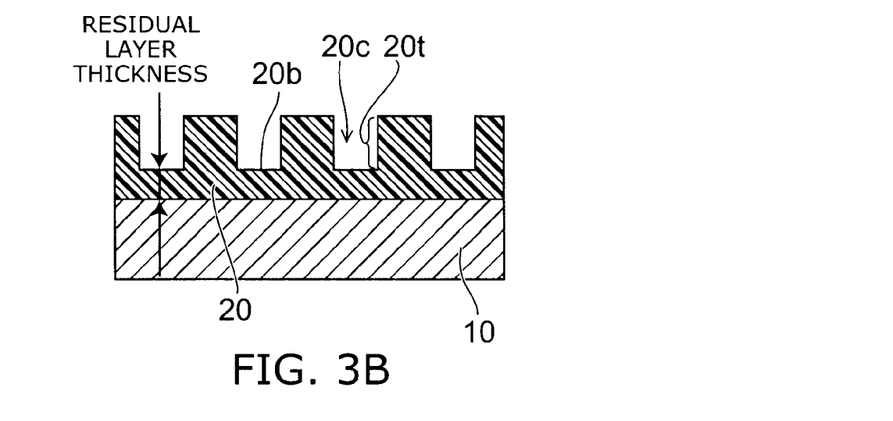
Figure 3C:
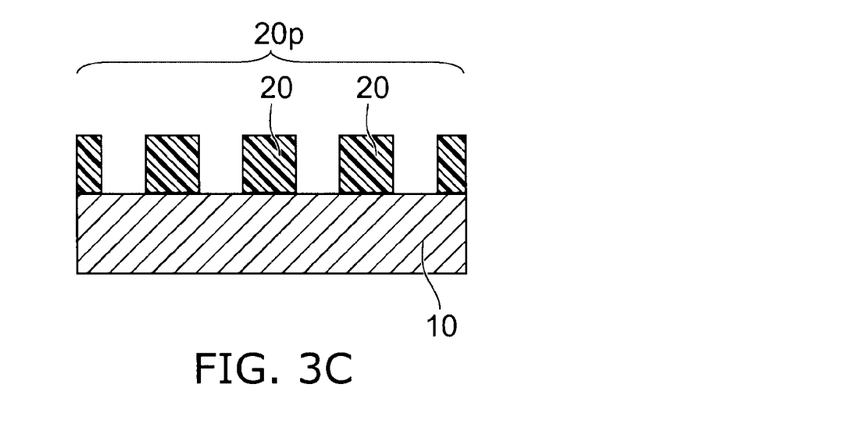

Next, as shown in FIG. 3B, the template 30 is released from the resist layer 20. Thus, the surface of the resist layer 20 is exposed. In the resist layer 20, protrusions 20t and depressions 20c have been formed.

The height of the protrusion 20t from the bottom surface 20b of the depression 20c of the resist layer 20 corresponds to the "pattern height". The thickness of the resist layer 20 between the bottom surface 20b of the resist layer 20 and the surface of the foundation 10 is defined as "residual layer thickness". The residual layer thickness is e.g. 15 nm.

Next, as shown in FIG. 3B, the patterned resist layer 20 is dry etched. This causes layer thinning of the protrusions 20t of the resist layer 20. On the other hand, in the depression 20c, the bottom surface 20b is etched. As a result, a line-and-space mask pattern 20p is formed on the foundation 10. By such a process, nanoimprint is performed on the resist.

The resist pattern formed by nanoimprint technology as described above can be used in the process for manufacturing electronic devices such as semiconductor devices. For instance, by using a prescribed method such as dry etching technology, the resist pattern formed as described above can be subsequently used as a mask to perform processing (e.g. patterning) on a to-be-processed layer (so-called underlying layer) of e.g. silicon material underlying the resist pattern. In the embodiment, for instance, the to-be-processed layer can be associated with the aforementioned pattern formation surface.

Next, a specific implementation of each step illustrated in FIG. 1 is described.

In the beginning, a specific procedure of steps S10-S40 is described.

First, in the flow of steps S10-S20, the total amount of resist required for the entire region of the pattern formation surface 25 is determined from the first input data, second input data, third input data, and fourth input data described below.

The first input data includes e.g. the pattern height of the template 30 and the required residual layer thickness.

The second input data includes e.g. the density distribution of the pattern (or the coverage distribution of the pattern) formed on the pattern formation surface by the template 30. Whether the pattern is sparse or dense is determined by the magnitude of pattern coverage. The pattern coverage refers to the ratio at which the mask pattern 20p covers the pattern formation surface 25 per unit area of the pattern formation surface 25.

As the second input data, it is also possible to select the density distribution of the pattern of the template 30. This is because the density distribution of the pattern formed on the pattern formation surface is substantially the same as the density distribution of the pattern of the template 30. In the following description, the density distribution of the pattern formed on the pattern formation surface is used.

Figure 4A:
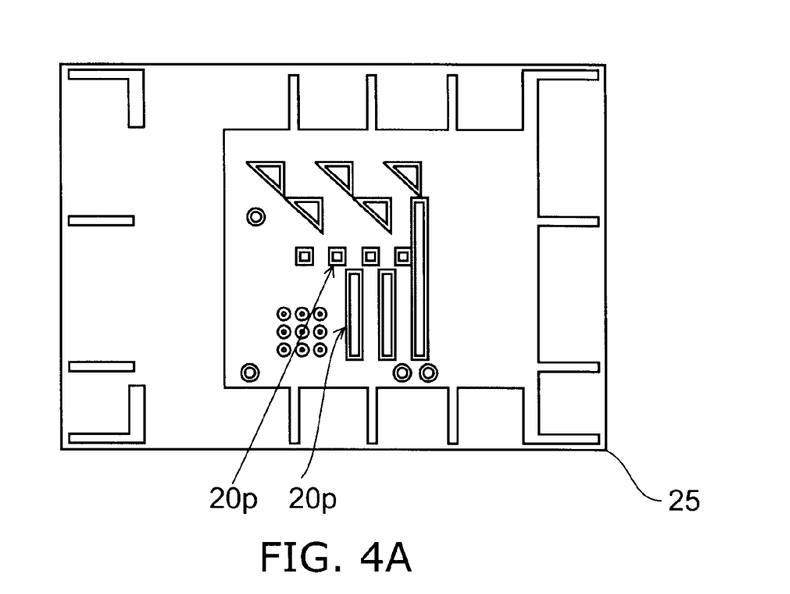
FIG. 4A and FIG. 4B describe the planar shape of a pattern.
Figure 4B:
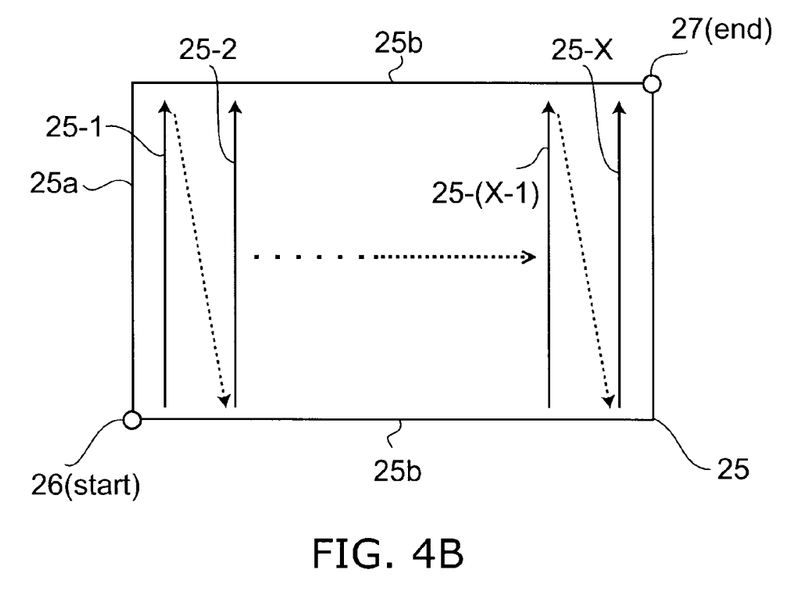

For instance, FIG. 4A and FIG. 4B describe the planar shape of a pattern. More specifically, FIG. 4A is a plan schematic view of the pattern, and FIG. 4B shows a method for calculating the pattern density.

As shown in FIG. 4A, a plurality of mask patterns 20p are formed in the pattern formation surface 25. The horizontal and vertical dimensions of the pattern formation surface 25 correspond to the horizontal and vertical dimensions of the pattern formation surface of the template 30. In the pattern formation surface 25, in the portion where the mask patterns 20p are located more closely, the density of the mask patterns 20p is higher.

Specifically, the density of the mask patterns 20p is calculated as shown in FIG. 4B.

First, the density of the mask patterns 20p is determined along a first line 25-1 parallel to the short side 25a of the pattern formation surface 25 from the start point 26 of the pattern formation surface 25. Next, from the start point 26 of the pattern formation surface 25 to the long side 25b opposed thereto, the density of the mask patterns 20p is determined along a second line 25-2 adjacent to the first line 25-1. This repeated scan is performed from the start point 26 to the end point 27 of the X-th line 25-X. Thus, the density distribution (coverage distribution) of the mask patterns 20p in the pattern formation surface 25 is determined.

The third input data includes e.g. the volatilization amount distribution of resist drops.

Figure 5A:
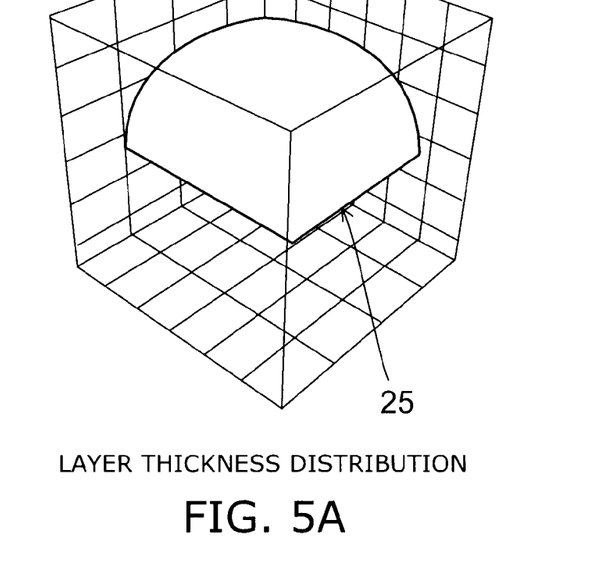
FIG. 5A and FIG. 5B are three-dimensional views describing the volatilization amount distribution of resist drops.
Figure 5B:
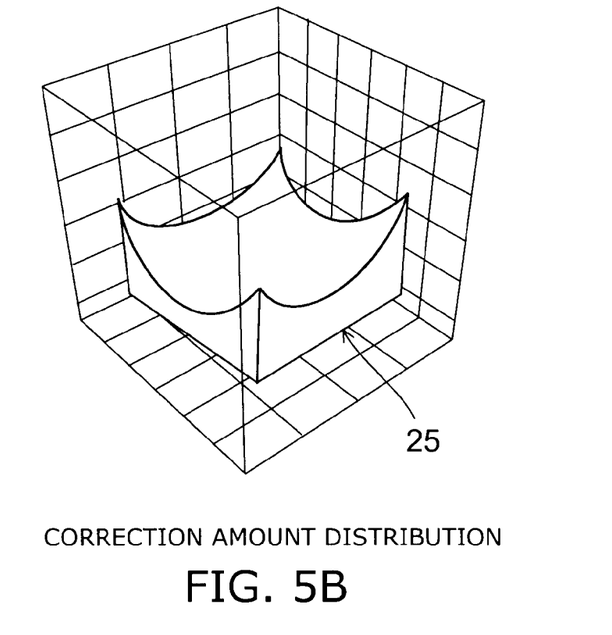

FIG. 5A and FIG. 5B are three-dimensional views describing the volatilization amount distribution of resist drops.

More specifically, FIG. 5A three-dimensionally shows the layer thickness distribution after volatilization of the resist drops distributed in the pattern formation surface 25.

During nanoimprint, resist drops are more likely to volatilize toward the edge of the template 30. Hence, after volatilization of the resist drops, as shown in FIG. 5A, the layer thickness of the resist drops may be thinner at the edge than in the central portion.

FIG. 5B three-dimensionally shows the layer thickness distribution of the resist drops in which the resist drop distribution in the pattern formation surface 25 is corrected based on the result of FIG. 5A. As described above, resist drops are more likely to volatilize toward the edge of the template 30. Thus, as shown in FIG. 5B, the total amount of resist is adjusted so that the volume of resist increases toward the edge of the pattern formation surface 25.

These first to third input data are calculated by partitioning the pattern data (GDS) in the pattern formation surface 25 into first regions of e.g. 5 μm×5 μm each.

The fourth input data includes e.g. the correction amount of the volume of the resist drop.

Figure 6:
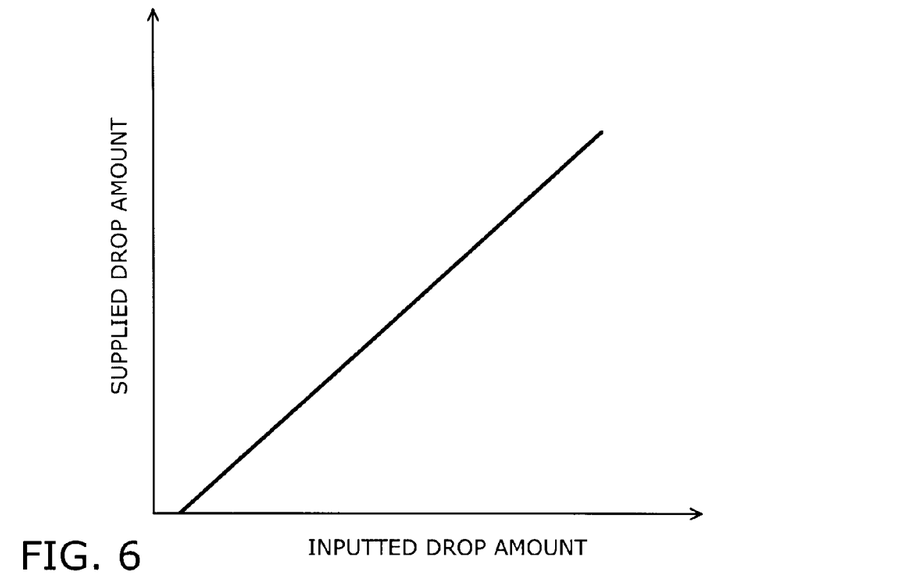
FIG. 6 shows the conversion between the input value and the supply amount of the resist drop.

FIG. 6 shows the conversion between the input value and the supply amount of the resist drop.

The horizontal axis of FIG. 6 represents the input value (indication value) of the resist drop 20*d*. The vertical axis represents the supply amount in which the resist drop 20*d* is actually supplied. In the case where there is a discrepancy between the input value of the resist drop 20*d* and the supply amount of the resist drop 20*d*, the conversion result shown in FIG. 6 is used to correct the total amount of resist.

Figure 7:
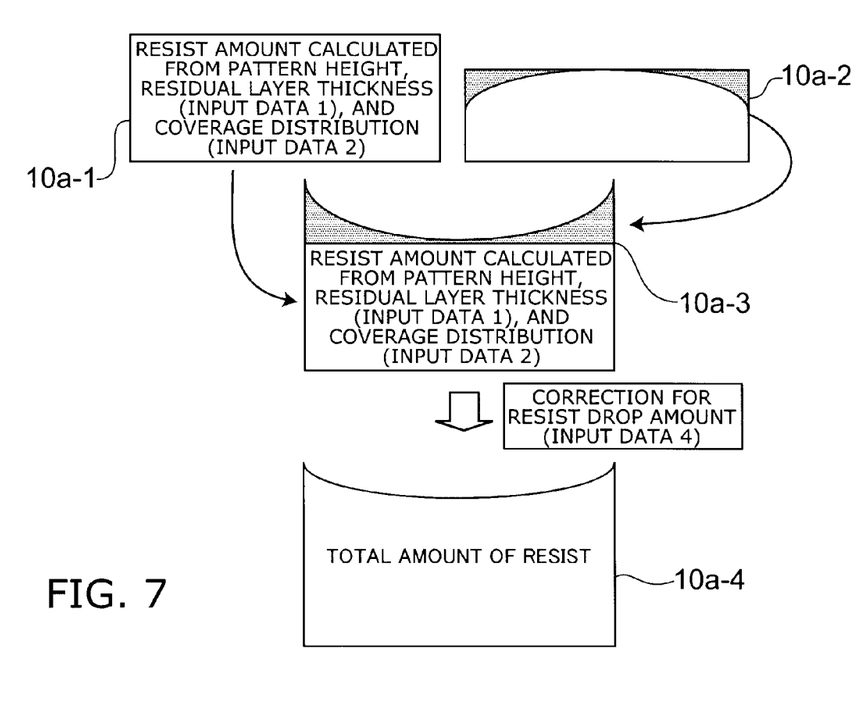
FIG. 7 is a view schematically describing a flow for determining the total amount of resist.

The flow for determining the total amount of resist can be summarized in a block diagram as shown in FIG. 7. The horizontal length of each block corresponds to e.g. the longitudinal length of the pattern formation surface 25.

The block 10*a*-1 represents the total amount of resist calculated from the first input data (pattern height, residual layer thickness) and the second input data (density distribution of the pattern).

The block 10*a*-2 represents the third input data (volatilization amount distribution of resist drops).

The block 10*a*-3 represents the total amount of resist in which the block 10*a*-1 is corrected by the third input data (block 10*a*-2). That is, the resist drop amount increases toward the edge of the block.

The block 10*a*-4 represents the total amount of resist in which the block 10*a*-3 is corrected by the fourth input data (correction amount of the resist drop amount).

If the total amount of resist is properly determined, the total amount of resist is divided by the volume (supply amount) of the resist drop 20*d* to determine the total number of resist drops 20*d* required for distribution in the pattern formation surface 25 (step S30).

Next, after the required number of resist drops 20*d* is calculated, a provisional position of each resist drop 20*d* is determined (step S40).

Here, an initial arrangement method for initially determining the provisional position of the resist drop 20*d* is described.

Figure 8A:
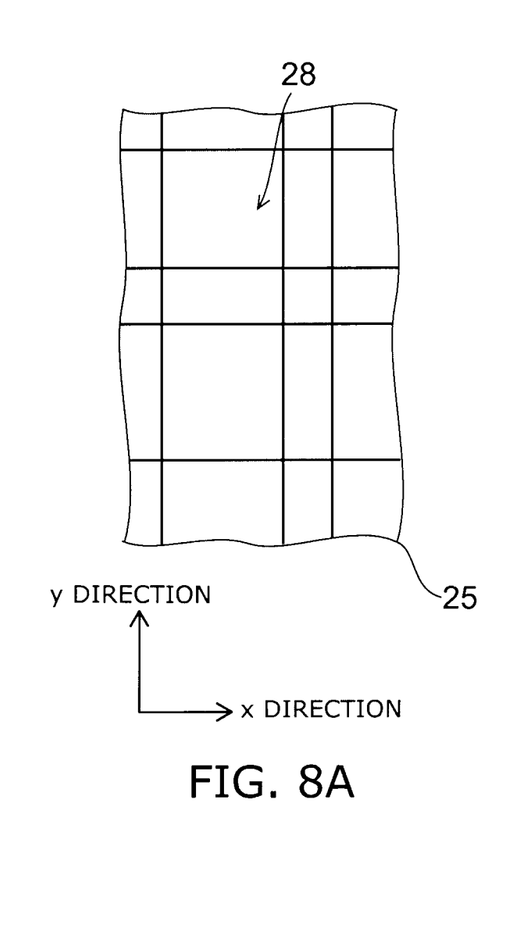
FIG. 8A shows forming unequally spaced rectangular regions.
Figure 8B:
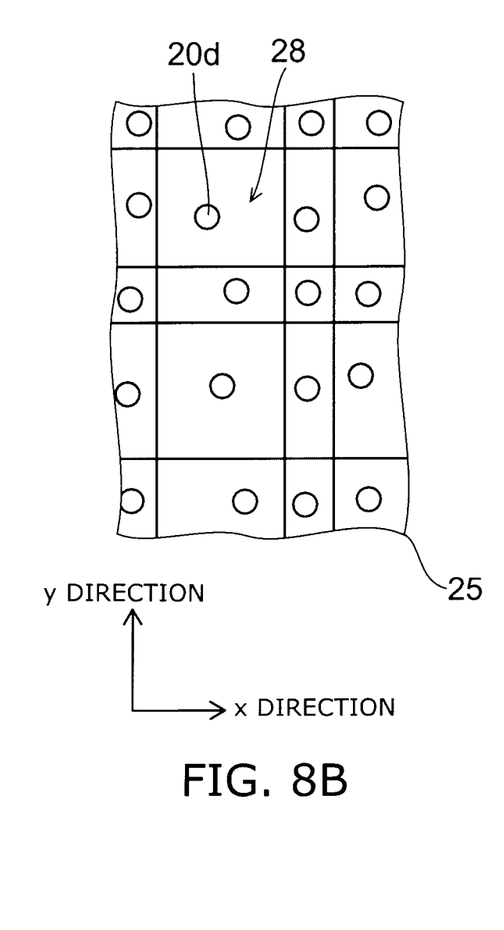
FIG. 8B shows arranging resist drops in unequally spaced first regions.

FIG. 8A and FIG. 8B describe the initial arrangement of resist drops. More specifically, FIG. 8A shows forming unequally spaced rectangular regions, and FIG. 8B shows arranging resist drops in unequally spaced first regions.

First, as shown in FIG. 8A, before the initial arrangement of resist drops 20*d*, the pattern formation surface 25 is partitioned into rectangular regions 28 at horizontally and vertically unequal distances.

For instance, the extending direction of the long side 25*b* of the pattern formation surface 25 is referred to as X direction (first direction), and the extending direction of the short side 25*a* is referred to as Y direction (second direction). Then, the pattern formation surface 25 is divided by lines unequally spaced in the X direction and lines unequally spaced in the Y direction. This results in rectangular regions 28 enclosed with the respective lines. The area of the rectangular region 28 with a relatively high pattern density is made smaller than the area of the rectangular region 28 with a relatively low pattern density. That is, as the area of the rectangular region 28 becomes larger, the pattern coverage in the rectangular region 28 becomes lower.

Here, the total volume of resist drops in the regions of the pattern formation surface 25 partitioned in the X direction, or the total volume of resist drops in the regions of the pattern formation surface 25 partitioned in the Y direction, is equal.

As shown in FIG. 8B, in each rectangular region 28, for instance, one resist drop 20*d* is arranged. In each rectangular region 28, the mask patterns 20*p* have a certain distribution. Hence, the resist drop 20*d* is arranged at the barycenter of each rectangular region 28. The barycenter of the rectangular region 28 is the equilibrium point of weight (first weight) converted from the pattern coverage of the rectangular region 28. Thus, the initial arrangement of resist drops 20*d* is completed.

Next, the flow of steps S50-S70 is specifically described.

Figure 9:
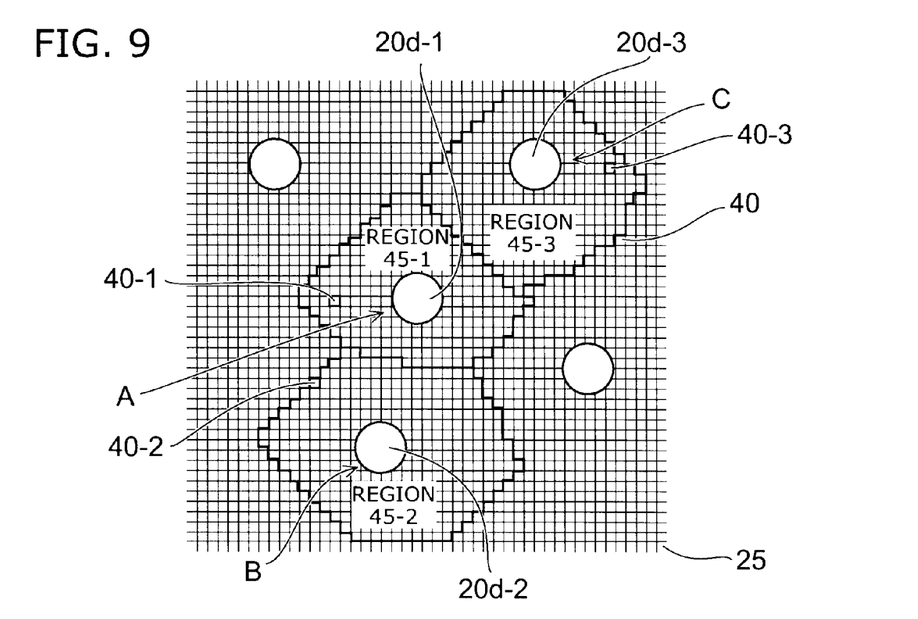
FIG. 9 is a view for describing the assignment of regions nearest to each resist drop.

FIG. 9 is an illustration for describing the assignment of regions nearest to each resist drop.

FIG. 9 shows a pattern formation surface 25 partitioned in advance into first regions 40 of 5 μm×5 μm each. In the pattern formation surface 25, by the initial arrangement, a plurality of resist drops 20*d* are distributed as shown.

Each first region 40 is assigned to the nearest resist drop 20*d*. The group of first regions 40 assigned to each resist drop 20*d* is defined as a second region 45.

That is, the pattern formation surface 25 is partitioned again into second regions 45 (step S50).

For instance, among the first regions 40, the first region 40-1 is nearest to the resist drop 20*d*-1 indicated by arrow A. Hence, the first region 40-1 is set to belong to the second region (nearest region) 45-1 nearest to the resist drop 20*d*-1.

On the other hand, the first region 40-2 is nearest not to the resist drop 20*d*-1, but to the resist drop 20*d*-2 indicated by arrow B. Hence, the first region 40-2 is set to belong to the second region 45-2 nearest to the resist drop 20*d*-2. Furthermore, the first region 40-3 is nearest to the resist drop 20*d*-3 indicated by arrow C. Hence, the first region 40-3 is set to belong to the second region 45-3 nearest to the resist drop 20*d*-3.

Thus, each first region 40 is assigned to its nearest resist drop 20*d*. Such assignment is performed for all the first regions 40 in the pattern formation surface 25.

Next, the volume of the resist drop for each assigned second region 45 is evaluated. For instance, the evaluation value for each second region 45 is determined (step S60). The evaluation value is given by the following equation (1).

$$\text{Evaluation value} = \frac{\text{(volume of one resist drop)}}{\text{(total of the required amount of resist determined for the first regions 40 belonging to the second region 45)}} \quad (1)$$

Here, the "volume of one resist drop" corresponds to each resist drop 20*d* present in each second region 45.

The "total of the required amount of resist determined for the first regions 40 belonging to the second region 45" is the sum over a given second region 45 of the amounts of resist required for the first regions belonging to that second region 45. In other words, "total of the required amount of resist determined for the first regions 40 belonging to the second region 45" is a sum of the amount of resist required for the each of the first regions 40 belonging to the each of the second regions 45. In the embodiment, the evaluation value in each second region 45 is calculated.

It is more desirable that the evaluation value of each second region be more approximate to "1". If the evaluation value is larger than "1", then in that second region, the volume of the resist drop is excessive, and the residual layer thickness may become thicker than the intended value. If the evaluation value is smaller than "1", then in that second region, the volume of the resist drop is deficient. The pattern depression of the template 30 may fail to be filled with the resist drop, or the residual layer thickness may become thinner than the intended value.

Next, it is determined whether the distribution of these evaluation values in the pattern formation surface falls within a target range (step S70).

Subsequently, if the distribution of the evaluation values in the pattern formation surface does not fall within the target range, the arrangement update of the resist drops 20d described below is performed.

In particular, immediately after the initial arrangement of resist drops 20d, the evaluation value of each second region is not necessarily approximate to "1". Hence, the evaluation value of each second region is made approximate to "1" by performing the arrangement update of the resist drops 20d.

Next, the arrangement update of the resist drops 20d in step S90 is described.

Figure 10:
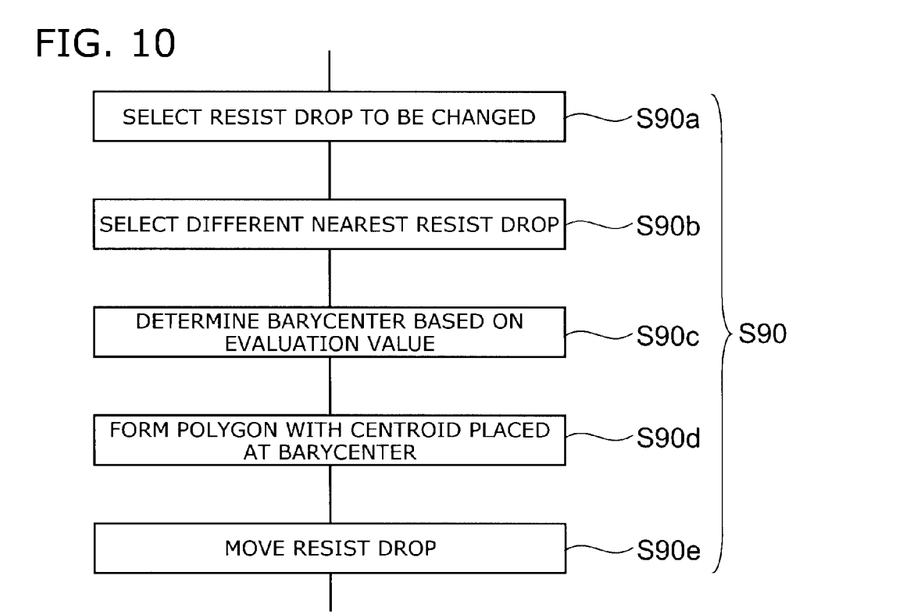
FIG. 10 is a flow chart describing the flow of the arrangement update of resist drops.

FIG. 10 is a flow chart describing the flow of the arrangement update of resist drops.

The arrangement update of the resist drops 20d in step S90 is described with reference to this flow chart and the following figure.

Figure 11:
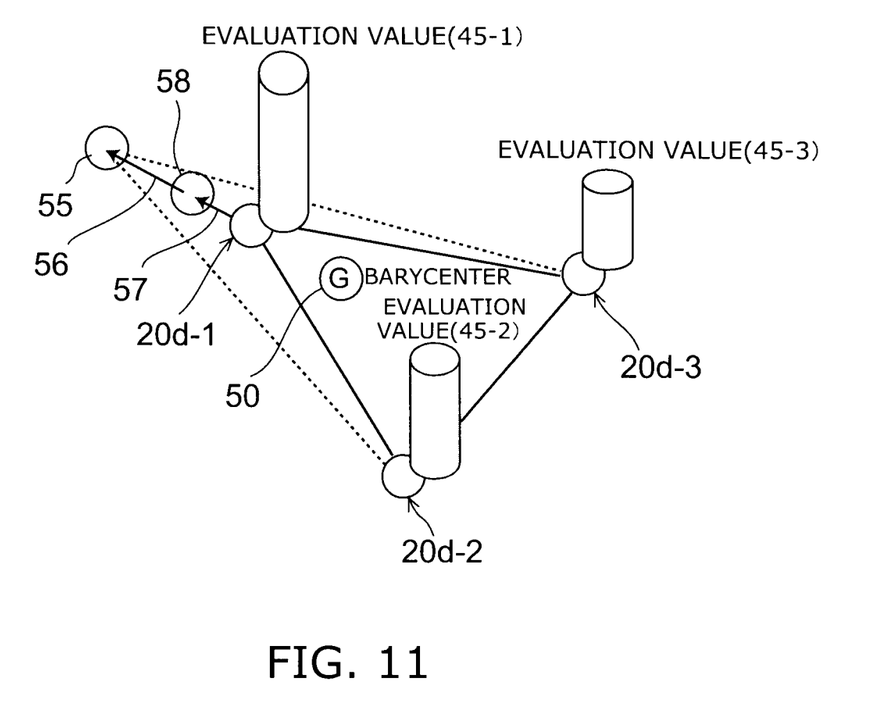
FIG. 11 is a schematic view of the arrangement update of resist drops.

FIG. 11 is a schematic view of the arrangement update of resist drops.

First, from among the resist drops 20d, at least one of the resist drops 20d to be moved is selected. In other words, the resist drop to be changed is selected (step S90a).

According to the embodiment, at least other two or more resist drops 20d nearest to the resist drops 20d to be moved are selected as an example. The one of the second regions 45 includes the one of the resist drops 20d to be moved. The another one of the second regions 45 includes each of the other resist drops 20d.

For instance, the resist drop 20d-1 in the figure is selected. Furthermore, at least one different resist drop nearest to the resist drop 20d-1 is selected (step S90b).

In the case of selecting two resist drops nearest to the resist drop 20d-1, for instance, the resist drop 20d-2 and the resist drop 20d-3 in the figure are selected. For the second region 45-1, the second region 45-2, and the second region 45-3 including the respective resist drops, evaluation values have already been determined.

Next, the evaluation values of the second region 45-1, the second region 45-2, and the second region 45-3 are each converted to e.g. a weight. Here, the weight converted from the second region 45-1 is defined as a second weight, the weight converted from the second region 45-2 or the second region 45-3 is defined as a third weight. The barycenter 50 based on the converted weights is determined (step S90c).

The barycenter 50 is the equilibrium point of the weights converted from the respective evaluation values. In the figure, the degree of weight is shown by the height of a cylinder. More specifically, in the example shown, the evaluation value in the second region 45-1 is highest, and the evaluation value in the second region 45-3 is lowest. Hence, the barycenter 50 is deviated from the centroid of the triangle with the vertices corresponding to the center points of the resist drops 20d-1, 20d-2, and 20d-3, and is biased toward the resist drop 20d-1.

Next, a polygon with the barycenter 50 placed at the centroid (center of figure) is formed. For instance, in the case where the resist drop 20d-1 is selected as the object of the arrangement update, with the barycenter 50 placed at the centroid, a polygon including as vertices the positions of the resist drop 20d-2 and the resist drop 20d-3 other than the resist drop 20d-1 is determined (step S90d).

In FIG. 11, as the polygon, a triangle is illustrated. In this triangle, the center points of the resist drops 20d-2 and 20d-3 are used as two vertices. The remaining vertex is determined to be the vertex 55 in the figure with the barycenter 50 placed at the centroid.

Next, a vector line 56 is drawn from the center point of the resist drop 20d-1 to the vertex 55. Subsequently, a shift vector line 57 is determined to be r (r<1) times the vector line 56. Then, the resist drop 20d-1 is moved toward the vertex 55 of the polygon. For instance, the resist drop 20d-1 is moved along the shift vector line 57 (step S90e). In the case where a triangle is drawn as the polygon, "r" is 1/10 or more and 1/2 or less. The arrangement update is performed for at least one of all the resist drops 20d.

Subsequently, the flow returns to step S50 shown in FIG. 1. After going to step S60, it is determined again whether the distribution of the evaluation values in the pattern formation surface 25 falls within the target range (step S70).

If the distribution of the evaluation values in the pattern formation surface 25 falls within the target range, the positions of all the resist drops 20d are finalized (step S80).

Subsequently, the nanoimprint illustrated in FIGS. 2A to 3C is performed. Then, the pattern depression of the template 30 does not fail to be filled with the resist drop 20d, and a residual layer thickness with uniform thickness is achieved on the foundation 10. That is, according to the embodiment, the arrangement of resist drops 20d in the pattern formation surface 25 is optimized to realize fine processing with high accuracy.

In the above example, two resist drops are selected as the resist drops nearest to the resist drop 20d-1. The number of selected resist drops nearest to the resist drop 20d-1 may be one, or three or more.

Next, a fine processing apparatus according to the embodiment is described.

Figure 12:
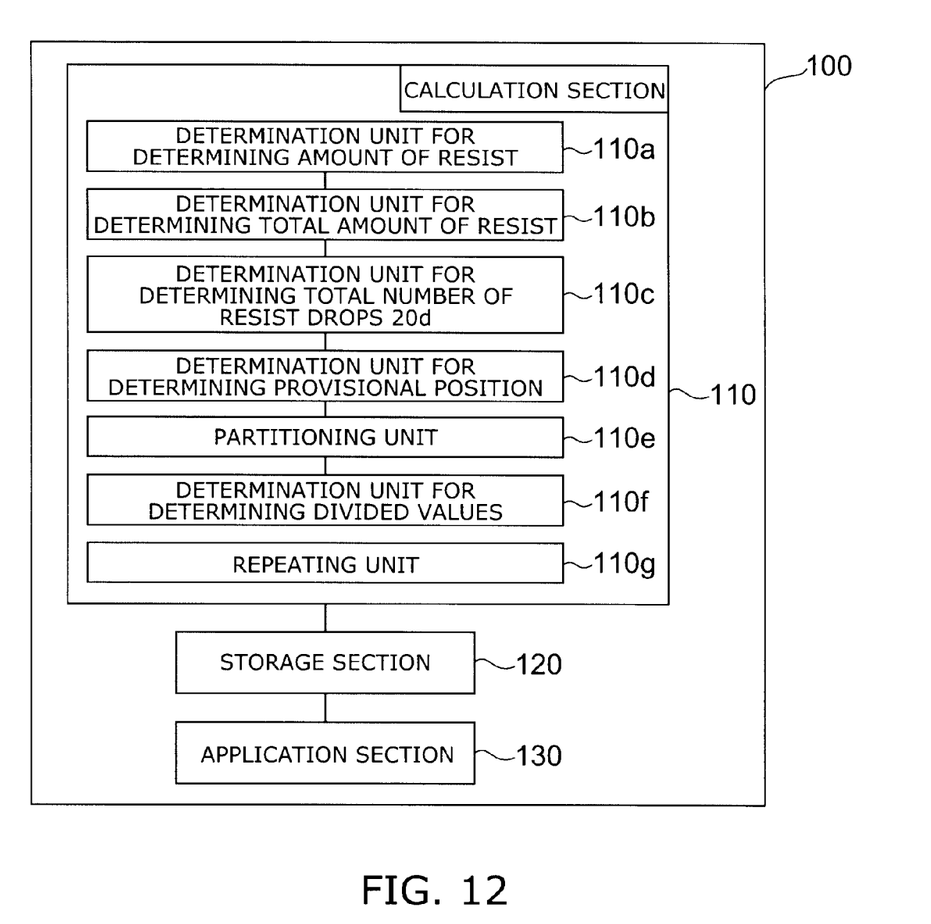
FIG. 12 is a block configuration diagram of the fine processing apparatus.

FIG. 12 is a block configuration diagram of the fine processing apparatus.

In fine processing using the fine processing apparatus 100, a plurality of resist drops 20d are two-dimensionally arranged on a pattern formation surface. A template 30 including protrusions and depressions is pressed onto the resist drops 20d to form a resist pattern on the pattern formation surface 25. The fine processing apparatus 100 determines the positions of the plurality of resist drops on the pattern formation surface.

The fine processing apparatus 100 includes a calculation section 110, a storage section 120, and an application section 130. By a computer, the fine processing apparatus 100 can automatically perform the fine processing method described with reference to FIG. 1 to FIG. 11. The calculation section 110, the storage section 120, and the application section 130 are connected on-line to each other. The calculation section 110, the storage section 120, and the application section 130 are not independent of each other, but managed by a CPU (central processing unit) of the fine processing apparatus 100.

The calculation section 110 includes a determination unit 110a. The determination unit 110a partitions the pattern formation surface 25 into a plurality of first regions 40. One of the first regions 40 is smaller than the area occupied by one resist drop 20d. The determination unit 110a determines the amount of resist required for each first region 40.

The calculation section 110 includes a determination unit 110b. The determination unit 110b sums the amounts of resist to determine the total amount of resist required for the entire region of the pattern formation surface 25.

The calculation section 110 includes a determination unit 110c. The determination unit 110c divides the total amount of resist by the volume of the resist drop 20d to determine the total number of resist drops 20d arranged on the pattern formation surface 25.

The calculation section 110 includes a determination unit 110d. For each resist drop 20d of the above total number, the determination unit 110d determines a provisional position on the pattern formation surface 25.

The calculation section 110 includes a partitioning unit 110e. The partitioning unit 110e assigns each first region 40 to the nearest resist drop 20d for each first region 40. The partitioning unit 110e defines the group of the first regions 40 assigned to each resist drop 20d as a second region 45. The partitioning unit 110e partitions again the pattern formation surface 25 into the second regions 45.

The calculation section 110 includes a determination unit 110f. For each second region 45, the determination unit 110f divides the volume of one resist drop by the required total amount of resist determined for the first regions 40 belonging to the second region 45 to determine the divided value.

The calculation section 110 includes a repeating unit 110g. If the distribution of the divided values in the pattern formation surface 25 falls within the target range, the repeating unit 110g finalizes the positions of all the resist drops 20d. If the distribution of the divided values in the pattern formation surface 25 does not fall within the target range, then until this distribution falls within the target range, the repeating unit 110g repeats changing the position of at least one of the resist drops 20d, and the operation of the partitioning unit 110e and the determination unit 110f for determining the divided value.

The determination unit 110d for determining the provisional position can place a resist drop 20d in each rectangular region 28. The rectangular region 28 is enclosed with lines partitioning the pattern formation surface 25 at unequal distances in the X direction (see FIG. 8A and FIG. 8B) and lines partitioning the pattern formation surface 25 at unequal distances in the Y direction perpendicular to the X direction.

The procedure for changing the position of the resist drop 20d follows the flow illustrated in FIG. 11.

The fine processing apparatus 100 further includes an application unit (application section 130) for two-dimensionally applying a plurality of resist drops 20d onto the pattern formation surface 25 after the positions of the resist drops 20d are finalized.

For instance, as shown in FIG. 2A, the application unit 130 can supply resist drops 20d onto the foundation 10 from a nozzle (not shown).

The storage unit 120, such as a recording medium, stores a fine processing program causing a computer to perform the flow illustrated with reference to FIGS. 1, 7, and 10.

The embodiments of the invention have been described above with reference to examples. However, the invention is not limited to these examples. That is, those skilled in the art can suitably modify these examples, and such modifications are also encompassed within the scope of the invention as long as they fall within the spirit of the invention. Various components of the above examples and their layout, material, condition, shape, size and the like are not limited to those illustrated above, but can be suitably modified.

Furthermore, various components of the above embodiments can be combined with each other as long as technically feasible. Such combinations are also encompassed within the scope of the invention as long as they fall within the spirit of the invention.

Furthermore, those skilled in the art can conceive various modifications and variations within the spirit of the invention. It is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A fine processing method for two-dimensionally arranging each of a plurality of resist drops on a pattern formation surface and pressing a template including protrusions and depressions onto the resist drops to form a resist pattern on the pattern formation surface, the method comprising:

partitioning the pattern formation surface into a plurality of first regions, one of the first regions being smaller than an area occupied by one of the resist drops, and determining an amount of resist required for each of the first regions;

determining a total amount of resist required for an entire region of the pattern formation surface from the amount of resist;

dividing the total amount of resist by a volume of the one of the resist drops to determine a total number of the resist drops arranged on the pattern formation surface;

determining a provisional position on the pattern formation surface for each of the resist drops of the total number as a first position;

assigning the first regions to the each of the resist drops, each group of the first regions assigned to the each of the resist drops being nearest to the each of the resist drops, defining the each group of the first regions as each of a plurality of second regions, and partitioning again the pattern formation surface into the second regions;

dividing, for the each of the second regions, the volume of the one of the resist drops by a sum of the amount of resist required for the each of the first regions belonging to the each of the second regions to determine a divided value;

finalizing a final position of the each of the resist drops as a second position, if a distribution of the divided value in the pattern formation surface falls within a target range, and repeating moving at least one of the resist drops, the partitioning, and the determining the divided value until the distribution falls within the target range, if the distribution of the divided value in the pattern formation surface does not fall within the target range.

2. The method according to claim 1, wherein the determining the first position includes placing the one of the resist drops in each of a plurality of rectangular regions enclosed with first lines partitioning the pattern formation surface at unequal distances in a first direction and second lines partitioning the pattern formation surface at unequal distances in a second direction perpendicular to the first direction.

3. The method according to claim 2, wherein a pattern coverage of the pattern formation in the each of the rectangular regions becomes lower as an area of the each of the rectangular regions becomes larger.

4. The method according to claim 3, wherein the pattern coverage is converted to a first weight in the each of the rectangular regions, and a first barycenter is determined from equilibrium of the first weight.

5. The method according to claim 4, wherein the one of the resist drops is arranged at the first barycenter.

6. The method according to claim 1, wherein in a routine of repeating the moving the at least one of the resist drops, the partitioning, and the determining the divided value, the total amount of resist is constant.

7. The method according to claim 1, wherein the moving the at least one of the resist drops includes:
   selecting at least other two or more resist drops nearest to the at least one of the resist drops to be moved;
   converting the divided value determined in one of the second regions to a second weight, the one of the second regions including the one of the resist drops to be moved, and the divided value determined in an another one of the second regions including each of the other resist drops to a third weight, and determining a second barycenter of the other resist drops and the at least one of the resist drops from the second weight and the third weight;
   forming a polygon including a position of the each of the other resist drops as a vertex with the second barycenter placed at a centroid; and
   moving the at least one of the resist drops toward another vertex of the polygon other than the vertex of the each of the other resist drops.

8. The method according to claim 1, wherein after the second position is finalized, the each of the resist drops are two-dimensionally arranged on the pattern formation surface, and the template is pressed onto the resist drops.

9. In fine processing for two-dimensionally arranging each of a plurality of resist drops on a pattern formation surface and pressing a template including protrusions and depressions onto the resist drops to form a resist pattern on the pattern formation surface, a fine processing apparatus for determining positions of the plurality of resist drops on the pattern formation surface, comprising:
   a first determination unit configured to partition the pattern formation surface into a plurality of first regions, one of the first regions being smaller than an area occupied by one of the resist drops, and to determine an amount of resist required for each of the first regions;
   a second determination unit configured to determine a total amount of resist required for an entire region of the pattern formation surface from the amount of resist;
   a third determination unit configured to divide the total amount of resist by a volume of the one of the resist drops to determine a total number of the resist drops arranged on the pattern formation surface;
   a fourth determination unit configured to determine a provisional position on the pattern formation surface for each of the resist drops of the total number as a first position;
   a partitioning unit configured to assign the first regions to the each of the resist drops, each group of the first regions assigned to the each of the resist drops being nearest to the each of the resist drops, to define the each group of the first regions as each of a plurality of second regions, and to partition again the pattern formation surface into the second regions;
   a fifth determination unit configured to divide, for the each of the second regions, the volume of the one of the resist drops by a sum of the amount of resist required for the each of the first regions belonging to the each of the second regions to determine a divided value;
   a repeating unit configured to finalize final position of the each of the resist drops as a second position, if a distribution of the divided value in the pattern formation surface falls within a target range; and
   to repeat moving at least one of the resist drops, the partitioning, and the determining the divided value until the distribution falls within the target range, if the distribution of the divided value in the pattern formation surface does not fall within the target range.

10. The apparatus according to claim 9, wherein the determination unit configured to determine the first position places the one of the resist drops in each of a plurality of rectangular regions enclosed with first lines partitioning the pattern formation surface at unequal distances in a first direction and second lines partitioning the pattern formation surface at unequal distances in a second direction perpendicular to the first direction.

11. The apparatus according to claim 10, wherein a pattern coverage of the pattern formation in the each of the rectangular regions becomes lower as an area of the each of the rectangular regions becomes larger.

12. The apparatus according to claim 11, wherein the pattern coverage is converted to a first weight in the each of the rectangular regions, and a first barycenter is determined from equilibrium of the first weight.

13. The apparatus according to claim 12, wherein the one of the resist drops is arranged at the first barycenter.

14. The apparatus according to claim 10, wherein in a routine of repeating the moving at least one of the resist drops, the partitioning, and the determining the divided value, the total amount of resist is constant.

15. The apparatus according to claim 9, wherein the moving the at least one of the resist drops includes:
   selecting at least other two or more resist drops nearest to the at least one of the resist drops to be moved;
   converting the divided value determined in one of the second regions to a second weight, the one of the second regions including the one of the resist drops to be moved, and the divided value determined in an another one of the second regions including each of the other resist drops to a third weight, and determining a second barycenter of the other resist drops and the at least one of the resist drops from the second weight and the third weight;
   forming a polygon including a position of the each of the other resist drops as a vertex with the second barycenter placed at a centroid; and
   moving the at least one of the resist drops toward another vertex of the polygon other than the vertex of the each of the other resist drops.

16. The apparatus according to claim 9, further comprising:
   an application unit configured to two-dimensionally apply the each of the plurality of resist drops onto the pattern formation surface after the second position is finalized.

* * * * *